(12) United States Patent
Wu et al.

(10) Patent No.: US 8,072,577 B2
(45) Date of Patent: Dec. 6, 2011

(54) LITHOGRAPHY SYSTEMS AND PROCESSES

(75) Inventors: Tzong Hsien Wu, Hsinchu (TW); Ta Hung Yang, Hsinchu (TW); Chih Yuan Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 1037 days.

(21) Appl. No.: 11/422,284

(22) Filed: Jun. 5, 2006

(65) Prior Publication Data
US 2007/0279604 A1    Dec. 6, 2007

(51) Int. Cl.
G02B 7/02 (2006.01)
G03B 27/32 (2006.01)
G03B 27/52 (2006.01)
G03B 27/54 (2006.01)

(52) U.S. Cl. ............... 355/55; 355/67; 355/77; 359/814

(58) Field of Classification Search .................. 355/18, 355/55, 67, 53, 77; 359/222.1, 684, 696, 359/703, 813–814; 430/322; 977/887
See application file for complete search history.

(56) References Cited

U.S. PATENT DOCUMENTS

| | | |
|---|---|---|
| 4,681,451 A | 7/1987 | Guerra et al. |
| 5,121,256 A | 6/1992 | Corle et al. |
| 5,125,750 A | 6/1992 | Corle et al. |
| 5,349,443 A | 9/1994 | Guerra |
| 5,497,359 A | 3/1996 | Mamin et al. |
| 5,939,709 A | 8/1999 | Ghislain et al. |
| 6,181,478 B1 | 1/2001 | Mandella |
| 6,335,130 B1 | 1/2002 | Chen et al. |
| 6,620,564 B2 | 9/2003 | Hung et al. |
| 6,686,098 B2 | 2/2004 | Czech et al. |
| 6,798,493 B2 | 9/2004 | Imanishi |
| 6,891,596 B2 | 5/2005 | Rostalski et al. |

(Continued)

FOREIGN PATENT DOCUMENTS
CN    1637612    7/2005
(Continued)

OTHER PUBLICATIONS

2nd Office Action of China counterpart application, issued on Mar. 27, 2009, p1-p7.

(Continued)

*Primary Examiner* — Hung Henry Nguyen
*Assistant Examiner* — Colin Kreutzer
(74) *Attorney, Agent, or Firm* — Jianq Chyun IP Office (57) ABSTRACT

An exemplary lithography process may include: receiving a substrate having a photo-sensitive layer; providing a light source capable of causing an exposure of a portion of the photo-sensitive layer; and providing a mask capable of defining at least one pattern that is to be transferred to the photo-sensitive layer. Specifically, the substrate has a top surface on or over the photo-sensitive layer, and the mask receives an electromagnetic wave from the light source at a first surface of the mask and generates a plurality of electromagnetic components from a second surface of the mask. The lithography process may also include: providing a lens, which provides a flat surface at a bottom surface of the lens, for transferring the pattern to the photo-sensitive layer; and adjusting the distance between the flat surface of the lens and the top surface of the substrate to control the number and amount of the electromagnetic components projected onto the photo-sensitive layer.

12 Claims, 7 Drawing Sheets

U.S. PATENT DOCUMENTS

| | | | |
|---|---|---|---|
| 6,916,592 | B2 | 7/2005 | Harada et al. |
| 6,949,323 | B2 | 9/2005 | Takeda et al. |
| 2003/0117938 | A1* | 6/2003 | Braitberg et al. ............ 369/291 |
| 2003/0174301 | A1* | 9/2003 | Imanishi ........................ 355/55 |
| 2004/0259036 | A1* | 12/2004 | Chappert et al. ............. 430/311 |
| 2005/0094258 | A1* | 5/2005 | Tanabe et al. ................ 359/368 |
| 2005/0145803 | A1* | 7/2005 | Hakey et al. ............... 250/491.1 |
| 2005/0190435 | A1* | 9/2005 | Shafer et al. ................. 359/365 |
| 2010/0091259 | A1* | 4/2010 | Koizumi ........................ 355/67 |

FOREIGN PATENT DOCUMENTS

| | | |
|---|---|---|
| CN | 1639644 | 7/2005 |
| CN | 1725109 | 1/2006 |
| CN | 1734353 | 2/2006 |
| WO | 2005/034174 | 4/2005 |
| WO | WO 2006061757 A1 * | 6/2006 |

OTHER PUBLICATIONS

"Sixth Office Action of China Counterpart Application", issued on Apr. 8, 2011, p. 1-p. 7.

Weisstein, Eric W., Frustrated Total Internal Reflection, Eric Weisstein's World of Physics, http://scienceworld.wolfram.com/physics/FrustratedTotalInternalReflection.htm, 1 page, Aug. 9, 2005.

Zemax—polarization; Polarisation and Coatings, http://www.optima-research.com/Software/Optical/Zemax/polarization.htm, 6 pages, Aug. 9, 2005.

Henderson, Tom; the Critical Angle, The Physics Classroom, Refraction and the Ray Model of Light—Lesson 3: Total Internal Reflection, http://www.glenbrook.k12.il.us/gbssci/phys/Class/refrn/u14l3c.html, 6 pages, Oct. 14, 2005.

Goldberg, Bennett B., et al., Immersion Lens Microscopy of Photonic Nanostructures and Quantum Dots, IEEE Journal of Selected Topics in Quantum Electronics, vol. 8, No. 5, Sep./Oct. 2002, pp. 1051-1059.

Ghislain, L.P., et al. Near-field photolithography with a solid immersion lens; Applied Physics Letters, vol. 74, No. 4, pp. 501-503, Jan. 25, 1999.

Tunneling Analog, frustrated total internal reflection (FTIR)—tunneling—barrier penetration, http://www.fas.harvard.edu/~scdiroff/lds/QuantumRelativity/TunnelingAnalog/TunnelingAnalog.html, 2 pages, Aug. 9, 2005.

Enkisch, H., et al., EUV lithography: technology for the semiconductor industry in 2010, Europhysics News (2004) vol. 35 No. 5, http://www.europhysicsnews.com/full/29/article3/article3.html, 8 pages Aug. 9, 2005.

Singh, R.N., et al., High-numerical-aperture optical designs, IBM J. Res. Develop., vol. 41, No. 1/2 Jan./Mar. 1997, pp. 39-48.

Lin, Burn J., Immersion lithography and its impact on semiconductor manufacturing, Optical Microlithography XVII, pp. 46-67. Feb. 24, 2004.

Melles Griot Optics Guide—Numerical Aperture and Magnification, Imaging Properties of a Lens System, http://www.mellesgriot.com/products/optics/fo_2_3.htm, 2 pages Nov. 20, 2005.

* cited by examiner

LITHOGRAPHY SYSTEMS AND PROCESSES

BACKGROUND OF THE INVENTION

1. Field of the Invention

The invention relates to lithography systems and lithography processes, and, specifically, relates to lithograph systems and processes that are capable adjusting the distance between a lens and the top surface of a substrate to control the number and amount of the electromagnetic components projected onto a photo-sensitive layer of the substrate.

2. Background

A lithography system has many applications. One of its popular applications is to perform exposure to define a pattern or image during the fabrication of semiconductor devices. Integrated circuits (ICs) and other semiconductor devices may be fabricated by forming and defining the shapes or patterns of various layers with various electrical, physical, or chemical characteristics. A lithography system, which performs a lithography process, enables the definition of patterns with very small dimensions, thereby providing a large number of electronic or mechanical components on a substrate for many different applications.

Figure 1:
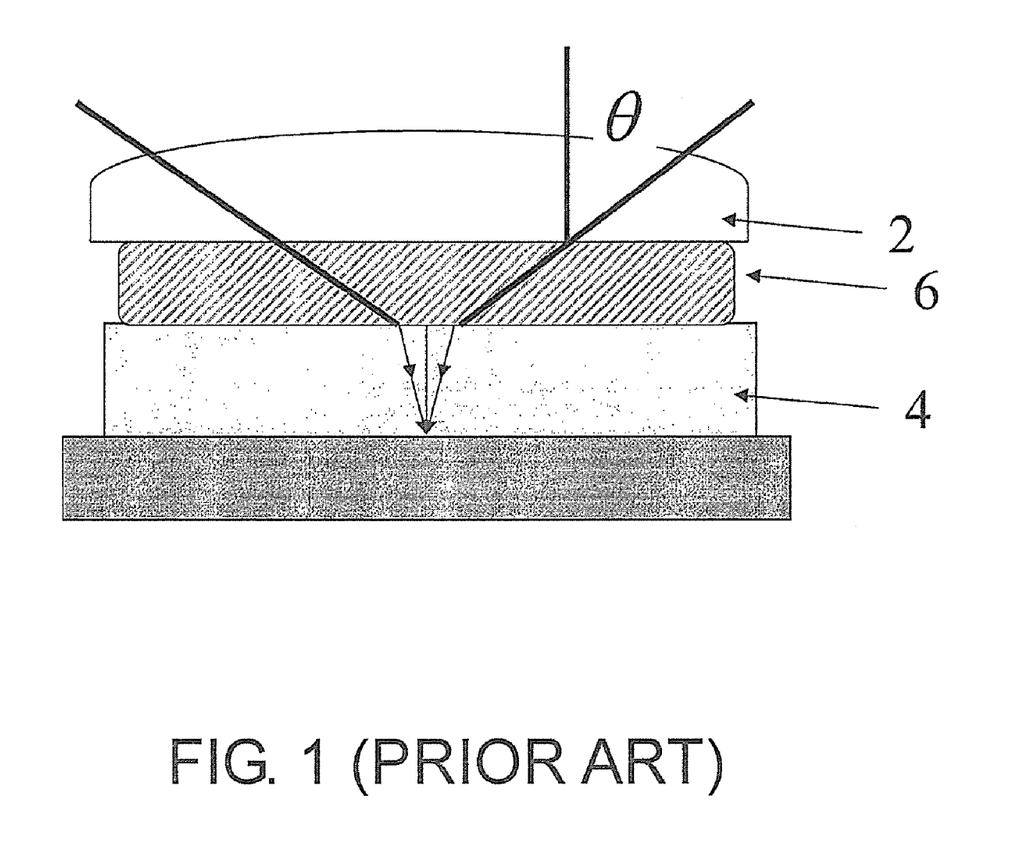
FIG. 1 illustrates a prior art lithography technique using a liquid as an intermediate medium.

However, many lithography systems or processes have limitations in its Resolution and its ability to define smaller patterns. One method to improve its resolution includes placing an intermediate substance, such as water or other liquid, between a focusing lens and a target. FIG. 1 illustrates an example of such technique. Referring to FIG. 1, between a lens 2 and a target 4 for exposure, a body of liquid 6, such as water, may be provided. Although the proposed technique may improve the resolution of the system in some applications, it also creates potential risks in contaminating the target with water or other intermediate substances inserted between the two subjects. It may also increase the complexity of a lithography system or process by requiring a good control of a body of liquid during the entire exposure process.

Therefore, there is a need for lithography systems or processes that may avoid one or more problems with the conventional techniques and provide better controllability or capability of lithography systems or processes.

BRIEF SUMMARY OF THE INVENTION

Examples consistent with the invention disclose lithography processes. A lithography process may include: receiving a substrate having a photo-sensitive layer; providing a light source capable of causing an exposure of a portion of the photo-sensitive layer; and providing a mask capable of defining at least one pattern that is to be transferred to the photo-sensitive layer. The mask receives an electromagnetic wave from the light source at a first surface of the mask and generates a plurality of electromagnetic components from a second surface of the mask. The lithography process may also include: providing a lens, which provides a flat surface at a bottom surface of the lens, for transferring the pattern to the photo-sensitive layer; and adjusting the distance between the flat surface of the lens and a top surface of the substrate to control the number and amount of the electromagnetic components projected onto the photo-sensitive layer.

Examples consistent with the invention further disclose a lithography system. The system may include: a substrate stage for supporting a substrate having a photo-sensitive layer; a light source capable of causing an exposure of a portion of the photo-sensitive layer; and a mask capable of defining at least one pattern that is to be transferred to the photo-sensitive layer. The mask receives an electromagnetic wave from the light source at a first surface of the mask and generates a plurality of electromagnetic components from a second surface of the mask. The lithography system may further include: a mask stage for supporting the mask; a lens, which provides a flat surface at a bottom surface of the lens, for transferring the pattern to the photo-sensitive layer; and a lens stage for supporting the lens. Furthermore, the lithography system may include a stage control device coupled with at least one of the substrate stage and the lens stage. The stage control device is capable of adjusting the distance between the flat surface of the lens and a top surface of the substrate to control the number and amount of the electro-magnetic components projected onto the photo-sensitive layer.

BRIEF DESCRIPTION OF THE SEVERAL VIEWS OF THE DRAWINGS

The foregoing summary, as well as the following detailed description of examples of the invention, will be better understood when read in conjunction with the appended drawings. For the purpose of illustrating the invention, the drawings provide illustrative examples. It should be understood, however, that the invention is not limited to the precise arrangements and instrumentalities shown. In the drawings.

DETAILED DESCRIPTION OF THE INVENTION

Examples consistent with the invention disclose lithography systems and processes. A lithography system or method may adjust the distance between a lower surface of the lens and the top surface of a substrate to control the number and/or amount of electro-magnetic components projected onto or received by a target layer. As a result, in one example, a pattern to be transferred to a target layer, such as a photo-sensitive layer, may be better controlled or defined by controlling the number and/or amount of pattern defining, electromagnetic components transmitted through a lens. In some examples, transmission ratio for components projected to a lens at different incident angles may vary according various factors, such as the incident angles and the controlled distance, thereby achieving desirable pattern-defining characteristics of a lithography system or process.

Figure 2:
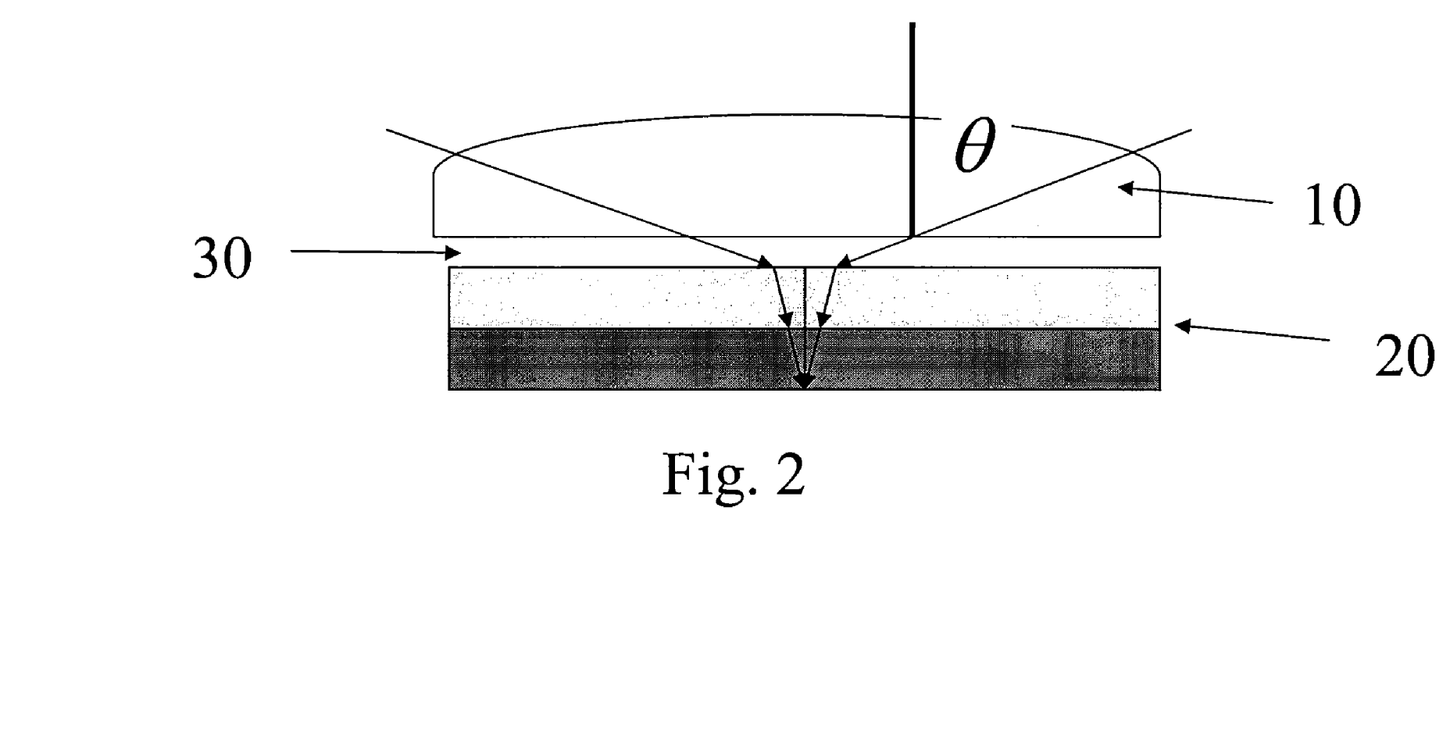
FIG. 2 illustrates a cross-sectional view of an exemplary substrate with a lens over it for exposure.

Referring to FIG. 2, a lens 10 may be used to focus or project electromagnetic components onto a target 20. In general, a lens may have a critical angle, which in one example may be regarded as an angle of incidence upon a lens surface above which an electromagnetic component is not transmitted, or is not transmitted entirely. However, depending on many factors, such as the material of the lens 10, its curvature, the environment surrounding the lens 10 and the target 20 and the wavelength of an electromagnetic wave, a tunnel effect may occur when the gap 30 between the target 20 and the bottom of the lens 10 becomes extremely small, allowing an incident wave to penetrate through lens 10 and gap 30 to reach the target. For example, a tunnel effect may occur for an incident wave at an incident angle larger than the critical angle when the gap 30 is sufficiently small.

Figure 3:
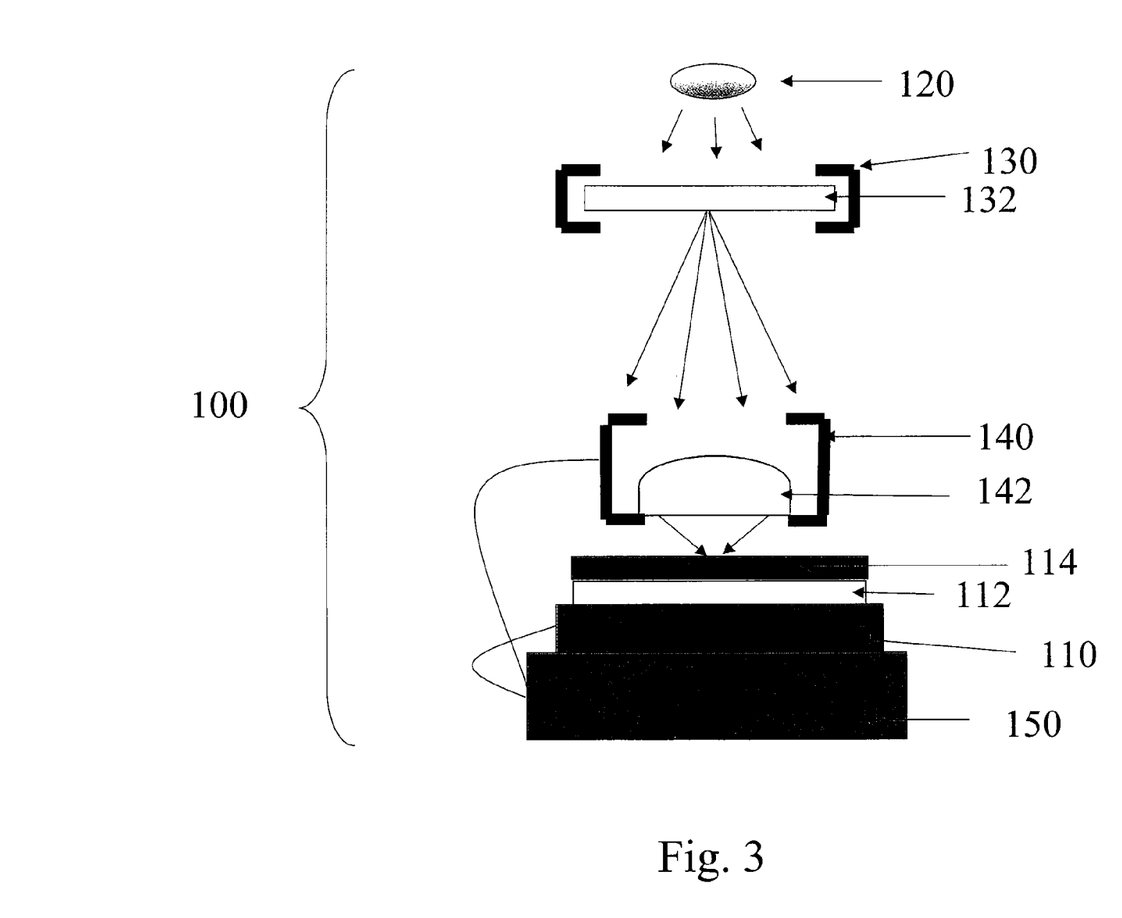
FIG. 3 illustrates a cross-sectional view of an exemplary lithography system in examples consistent with the invention.

FIG. 3 illustrates an exemplary lithography system in examples consistent with the invention. Referring to FIG. 3, a lithography system 100 in one example may include a substrate stage 110, a light source 120, a mask stage 130, a lens stage 140, and a stage control device 150. The lithography system 100 may have various applications, including fabricating semiconductor devices such as integrated circuits, other electrical components, and mechanical devices. In some examples, the substrate stage 110 may be a fixed or movable stage for supporting a substrate 112, which may have a photo-sensitive layer 114 and a top surface on or over the photo-sensitive layer 114. The substrate 112 may have other layers above the photo-sensitive layer 114, such as one or more anti-reflection layers above the photo-sensitive layer, one or more anti-reflection layers under the photo-sensitive layer, and other layers for forming semiconductor devices in or on the substrate 112. In one example, the photo-sensitive layer 114 may include a photoresist layer or chemical.

The light source 120 may provide an electromagnetic wave capable of causing an exposure of a portion of the photo-sensitive layer 114. In one example, the light source may emit an ultraviolet electromagnetic wave, which may have a wavelength of several hundred nanometers ("nm") or less. For example, an ultraviolet electromagnetic wave having a wavelength of about 248 nm may be used in one example, and an ultraviolet electromagnetic wave having a wavelength of about 193 nm may be used in another example.

The mask stage 130 may be a fixed or movable stage for supporting a mask 132. The mask 132 may be capable of defining at least one pattern that is to be transferred to the photo-sensitive layer 114. In one example, the mask 132 receives an electromagnetic wave from the light source 120 at a first surface or upper surface of the mask 132 and generating a number of electromagnetic components from a second surface or lower surface of the mask 132. Depending on the configuration of the mask 132, different electromagnetic components generated after the incident electromagnetic wave passes through the mask 132 may leave from the mask 132 at different angles. In one example, the mask 132 may include a number of diffraction gratings, and a proper collection of the diffraction components through a lens or an equivalent device may then define the pattern transferred to the photo-sensitive layer 114. Various diffraction components may came out from the mask 132 at different angles with different characteristics or portions of the pattern to be transferred. Therefore, depending on the number and amount of components that are transmitted through a lens, the definition and/or resolution of the pattern being transferred to the photo-sensitive layer may vary.

The lens stage 140 may be a fixed or movable stage for supporting a lens 142. In lithography systems or applications for fabricating a semiconductor device, the lens stage may be movable in a three-dimension manner to not only adjust its focus, its distance from a target, but also to allow a scanning operation with horizontal, 2-dimensional movements. The lens 142 is for transferring a pattern to the photo-sensitive layer 114. Referring to FIG. 3, the lens 142 may provide a flat surface at a bottom surface of the lens or, as illustrated, having its entire bottom surface flat.

As illustrated above, one or both of the substrate stage 110 and the lens stage 140 may be movable, thereby allowing the adjustment of the distance between the two. In some examples, the lithography system 100 may include the stage control device 150 coupled with one or both of the substrate stage 110 and the lens stage 140 to allow the device to control of one or both of the stages. The stage control device 150 may be capable of adjusting the distance between the lower flat surface of the lens 142 and the top surface of the substrate 112 to control the number and amount of the electromagnetic components projected onto the photo-sensitive layer 114. By allowing the control of the electromagnetic components, such as diffraction components, transmitted through the lens, the characteristics in transferring the pattern to the photo-sensitive layer 114 may be adjusted. For example, characteristics such as the NA (numerical aperture) and/or the resolution of the transferred pattern or image may be adjusted. As illustrated, the flat surface of the lens and the top surface of the substrate may be provided without an intermediate substance, such as water or other liquids used in a conventional system, in-between to simplify the system or the lithography process, and, in some instances, to avoid undesirable contamination. In some examples, the distance between the flat surface of the lens 30 and the top surface of the substrate may be less than 400 nm and may be as little as 10 or a few nanometers. In some applications, to facilitate a scanning operation or the relative movement between the lens 142 and the substrate 112, the top surface of the substrate 112 may be provided with a surface flatness variation of about or less than 100 or 50 angstroms, i.e. 10 or 5 nm.

Using the examples of a lithography system illustrated above or another lithography system, a lithography process may be performed with several steps. In one example, a lithography process may include receiving a substrate having a photo-sensitive layer; providing a light source capable of causing an exposure of at least a portion of the photo-sensitive layer; and providing a mask capable of defining at least one pattern that is to be transferred to the photo-sensitive layer. As illustrated above, the substrate has a top surface on or over the photo-sensitive layer and may have one or more anti-reflection layers. Additionally, the mask may receive an electromagnetic wave from the light source at a first surface of the mask and then generate a number of electromagnetic components from a second surface of the mask. Furthermore, the lithography process may also include providing a lens, which may provide a flat surface at a bottom surface of the lens, for transferring the pattern to the photo-sensitive layer; and adjusting the distance between the flat surface of the lens and the top surface of the substrate to control the number and amount of the electromagnetic components projected onto the photo-sensitive layer.

Figure 4:
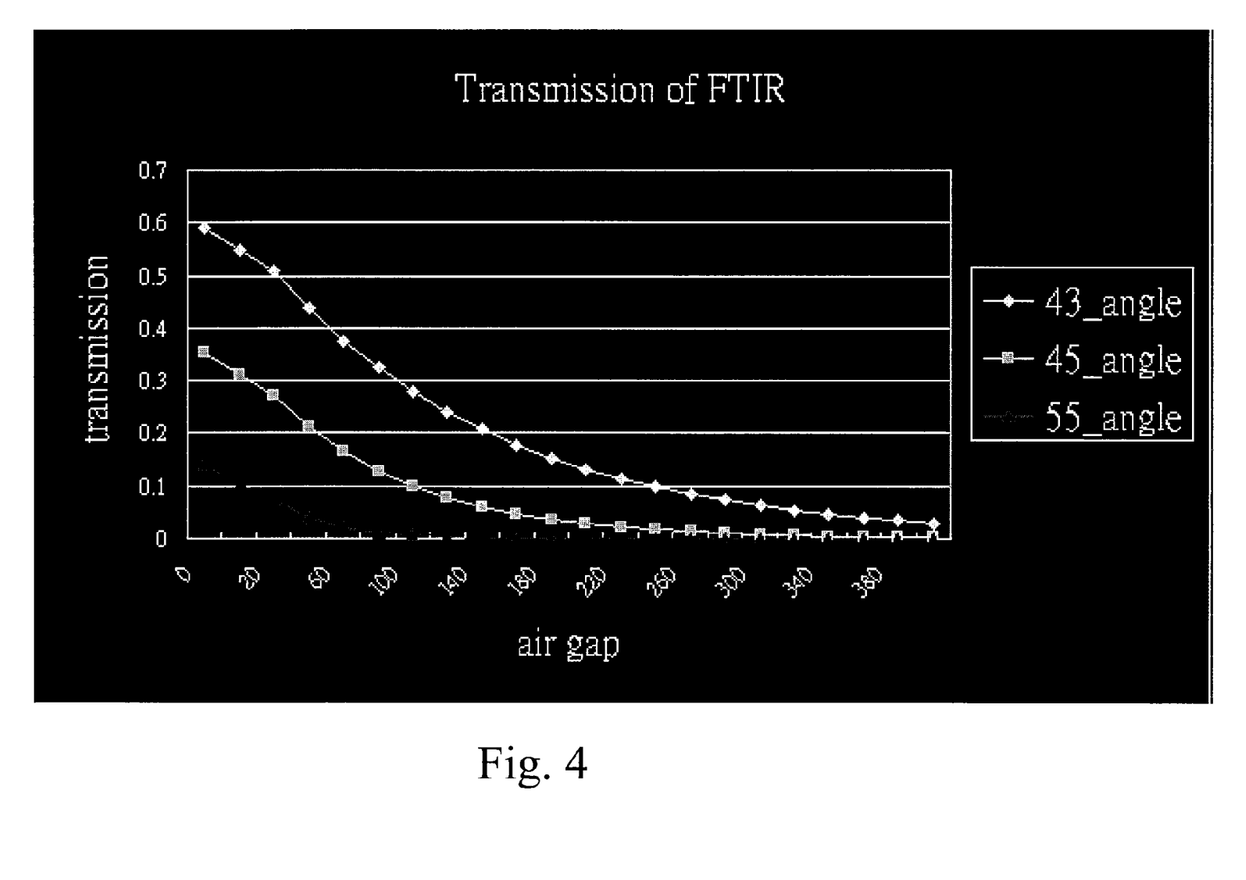
FIG. 4 illustrates an exemplary plot illustrating the ratio of electromagnetic components transmitted through a lens at different air gaps in an example using a light source having a wavelength of about 248 nanometers.
Figure 5:
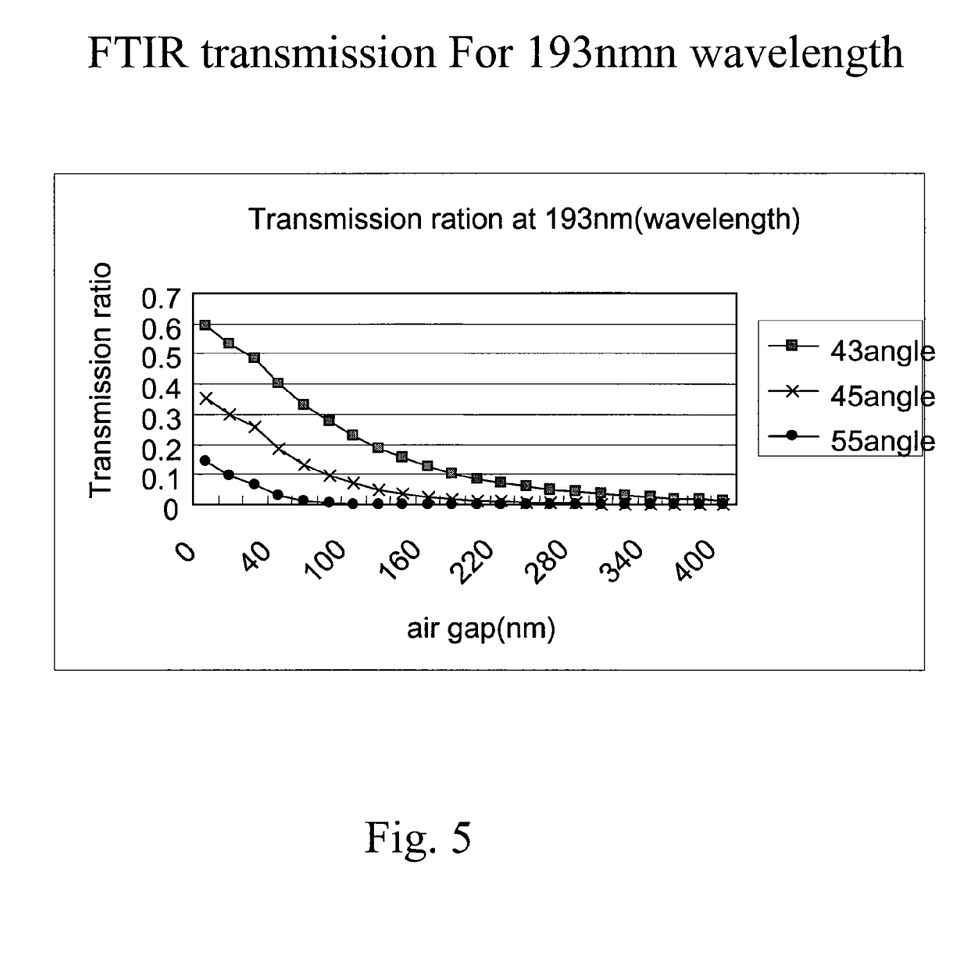
FIG. 5 illustrates an exemplary plot illustrating the ratio of electromagnetic components transmitted through a lens at different air gaps in an example using a light source having a wavelength of about 193 nanometers.

The transmission rate of various electromagnetic components through a lens 142 and a gap between a lens and target may depend on many different factors. FIG. 4 illustrates an exemplary plot illustrating the ratio of electromagnetic components incident at three separate angles and transmitted through a lens at different air gaps in an example using a light source of a wavelength of about 248 nm. In this example, the transmission ratio increase gradually after the gap becomes smaller than 400 nm, and a percentage of the components started to be transmitted as the gap approaches 300 or 200 nm, depending on the angles of separate components. FIG. 5 illustrates an exemplary plot illustrating the ratio of electromagnetic components transmitted through a lens at different air gaps in an example using a light source of a wavelength of about 193 nm. In this example, the transmission ratio increases gradually after the gap becomes smaller than 400 nm, and a percentage of the components started to be transmitted as the gap approaches 250 or 100 nm, depending on the angles of separate components.

Figure 6:
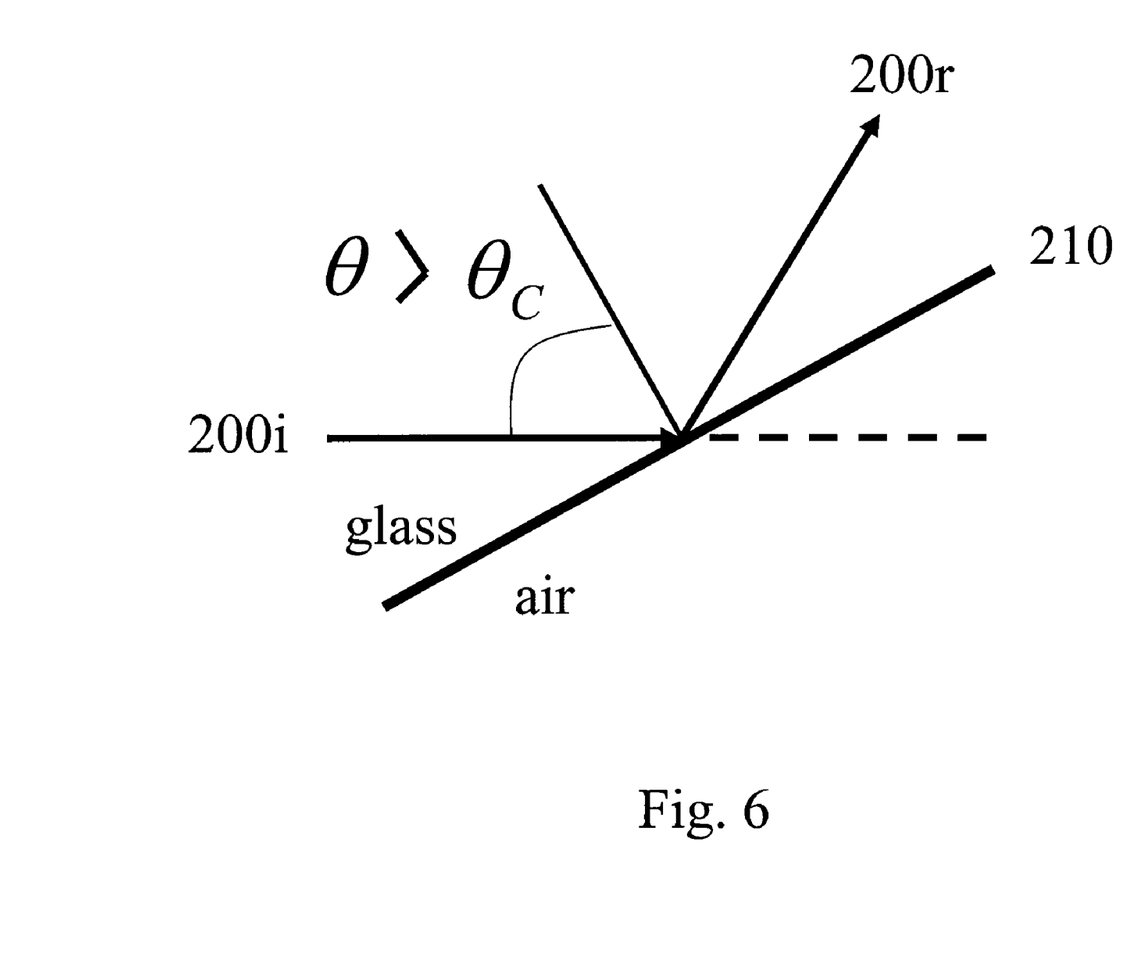
FIG. 6 illustrates an exemplary illustration of internal total reflection phenomena at a glass-air interface.
Figure 7:
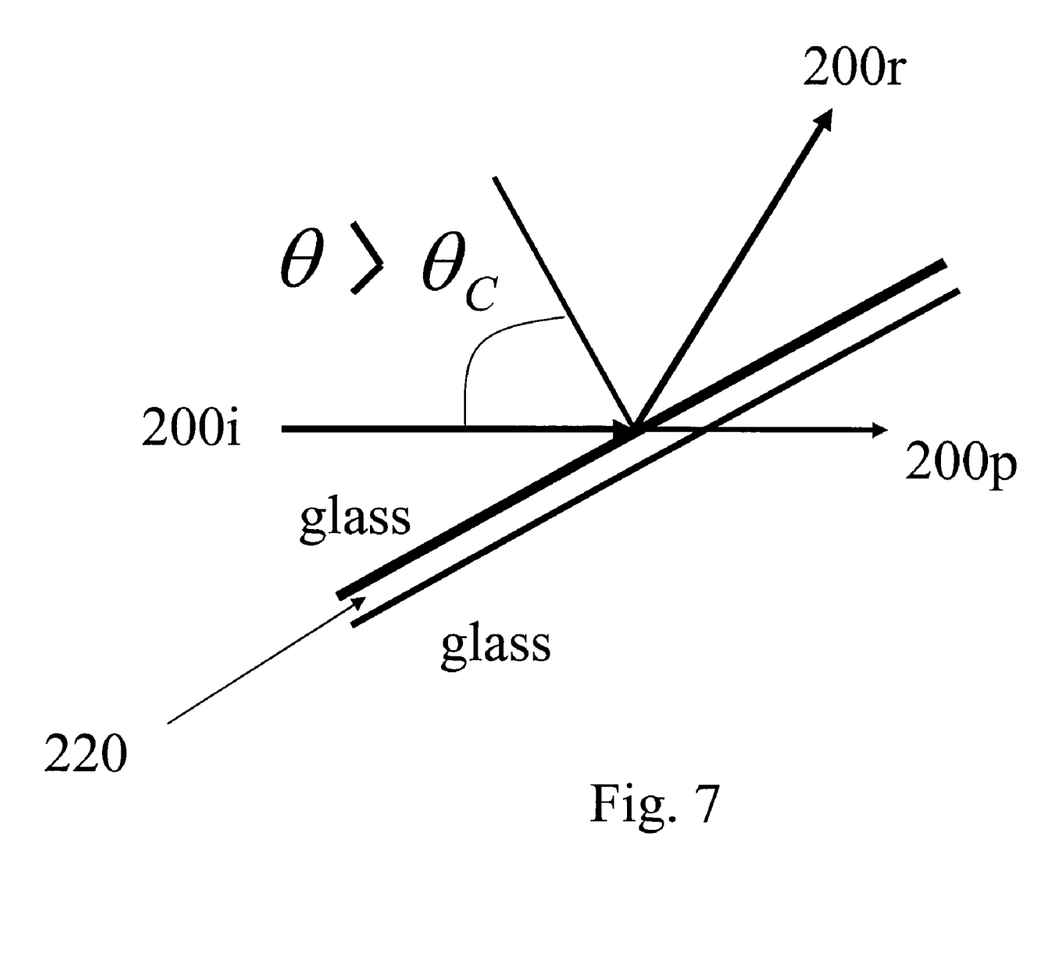
FIG. 7 illustrates an exemplary illustration of the phenomenon of frustrated total internal reflection at an exemplary glass-air-glass interface.

FIG. 6 illustrates a schematic diagram to illustrate the phenomena of internal total reflection within a medium, such as a glass, at its interface 210 with another material, such as air. When the angle θ of an incident light 200$i$ is larger than critical angle θc, the incident light 200$i$ is typically reflected in its entirety as the reflected light 200$r$. θc is about 41.8 in this glass-air interface example. As a result, any wave penetration through the glass-air interface 210 is minimal or undetectable. However, under certain conditions, wave penetration may become possible. For example, wave penetration may occur when the air gap between two materials, such as two glasses or a glass and another medium, is small. FIG. 7 illustrates a schematic diagram to illustrate an exemplary case where wave penetration becomes detectable. In this example, even when the angle θ of the incident light 210$i$ is larger than critical angle θc, the incident light 200$i$ is only partially reflected as the reflected light 200$r$ when the air gap becomes extremely small. And a portion of the incident light 200$i$ may penetrate through the air gap as penetrated light 200$p$ and reach its underlying medium, such as another glass, a photoresist layer, or a layer above a photoresist layer, such as an anti-reflective layer. The phenomenon is known as frustrated total internal reflection in some applications, which may be explained under the principle of quantum effect. Accordingly, in some lithography processes, the pattern definition or exposure process may be controlled to reach desirable results.

As discussed above, examples of lithography systems and processes have been described. The foregoing disclosure of various examples consistent with the present invention has been presented for purposes of illustration and description. It is not intended to be exhaustive or to limit the invention to the precise forms disclosed. Many variations and modifications of the examples described herein can be made without departing from the spirit of the invention. Accordingly, the scope of the invention is to be defined only by the claims appended hereto, and by their equivalents.

We claim:

1. A lithography process comprising:
   receiving a substrate having a photo-sensitive layer;
   providing a light source capable of causing an exposure of a portion of the photo-sensitive layer;
   providing a mask capable of defining at least one pattern that is to be transferred to the photo-sensitive layer, the mask receiving an electromagnetic wave from the light source at a first surface of the mask and generating a plurality of electromagnetic components from a second surface of the mask, wherein the electromagnetic components include diffractions of the electromagnetic wave;
   providing a lens for transferring the pattern to the photo-sensitive layer, the lens providing a flat surface at a bottom surface of the lens and being moved in a three-dimension translational manner; and
   adjusting a distance between the flat surface of the lens and a top surface of the substrate to control the number and amount of the electromagnetic components projected onto the photo-sensitive layer.

2. The lithography process of claim 1, wherein the flat surface of the lens and the top surface of the substrate are provided without an intermediate substance in-between.

3. The lithography process of claim 1, wherein the light source comprises an ultra violet light source having a wave length that is about 248 nanometers or less.

4. The lithography process of claim 1, wherein the distance between the flat surface of the lens and the top surface of the substrate is less than 400 nanometers.

5. The lithography process of claim 1, wherein the top surface of the substrate has a surface flatness variation of about or less than 100 angstroms.

6. The lithography process of claim 1, wherein the photo-sensitive layer comprises a photoresist layer.

7. The lithography process of claim 1, wherein the substrate has an anti-reflection layer over the photo-sensitive layer.

8. A lithography system comprising:
   a substrate stage for supporting a substrate having a photo-sensitive layer;
   a light source capable of causing an exposure of a portion of the photo-sensitive layer;
   a mask capable of defining at least one pattern that is to be transferred to the photo-sensitive layer, the mask receiving an electromagnetic wave from the light source at a first surface of the mask and generating a plurality of electromagnetic components from a second surface of the mask, wherein the electromagnetic components include diffractions of the electromagnetic wave;
   a mask stage for supporting the mask;
   a lens for transferring the pattern to the photo-sensitive layer, the lens providing a flat surface at a bottom surface of the lens;
   a lens stage for supporting the lens, the lens stage moving the lens in a three-dimension translational manner; and
   a stage control device coupled with at least one of the substrate stage and the lens stage, the stage control device being capable of adjusting a distance between the flat surface of the lens and a top surface of the substrate to control the number and amount of the electromagnetic components projected onto the photo-sensitive layer.

9. The lithography system of claim 8, wherein the flat surface of the lens and the top surface of the substrate are provided without an intermediate substance in-between.

10. The lithography system of claim 8, wherein the light source comprises an ultra violet light source having a wave length that is about 248 nanometers or less.

11. The lithography system of claim 8, wherein the distance between the flat surface of the lens and the top surface of the substrate is less than 400 nanometers.

12. The lithography system of claim 8, wherein the top surface of the substrate has a surface flatness variation of about or less than 100 angstroms.

* * * * *